United States Patent
Wang et al.

(10) Patent No.: US 10,874,025 B2
(45) Date of Patent: *Dec. 22, 2020

(54) PULL-OUT AIDING DEVICE AND CHASSIS-WALL MODULE WITH PULL-OUT AIDING FUNCTION

(71) Applicant: FIVETECH TECHNOLOGY INC., New Taipei (TW)

(72) Inventors: Ting-Jui Wang, New Taipei (TW); Chia-Ching Liao, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 48 days.

This patent is subject to a terminal disclaimer.

(21) Appl. No.: 15/990,867

(22) Filed: May 29, 2018

(65) Prior Publication Data
US 2018/0279495 A1    Sep. 27, 2018

Related U.S. Application Data

(62) Division of application No. 15/381,589, filed on Dec. 16, 2016, now abandoned.

(51) Int. Cl.
| | | |
|---|---|---|
| *A47B 81/00* | (2006.01) | |
| *H05K 7/14* | (2006.01) | |
| *G11B 33/12* | (2006.01) | |
| *G06F 1/18* | (2006.01) | |

(52) U.S. Cl.
CPC .......... *H05K 7/1402* (2013.01); *G06F 1/187* (2013.01); *G11B 33/124* (2013.01)

(58) Field of Classification Search
CPC ...... H05K 7/1402; G11B 33/124; G06F 1/187
See application file for complete search history.

(56) References Cited

U.S. PATENT DOCUMENTS

| | | | |
|---|---|---|---|
| 6,288,902 B1 | 9/2001 | Kim et al. | |
| 6,601,933 B1 * | 8/2003 | Greenwald | H05K 7/1489 312/330.1 |
| 7,559,782 B2 | 7/2009 | Yuh | |
| 7,830,656 B2 * | 11/2010 | Ding | G06F 1/187 361/679.37 |
| 8,118,267 B2 * | 2/2012 | Yu | H05K 7/1489 248/222.11 |
| 8,705,230 B2 | 4/2014 | Wen | |
| 9,027,767 B2 * | 5/2015 | Buckley | A47F 5/00 211/134 |

(Continued)

FOREIGN PATENT DOCUMENTS

CN    205450919 U  *  8/2016  ........... G11B 33/128

*Primary Examiner* — Matthew W Ing
(74) *Attorney, Agent, or Firm* — Schmeiser, Olsen & Walts, LLP

(57) ABSTRACT

A pull-out aiding device is configured for mounting on an object, in which a corresponding apparatus is mounted. The pull-out aiding device includes a pulling member and a handle member. The pulling member includes a first pivot section and an abutting section for abutting against the corresponding apparatus to move the latter forward. The handle member includes a second pivot section and an operating section. The second pivot section is pivotally connected to the first pivot section, such that the handle member is turnable about the second pivot section relative to the pulling member and brings the latter to move forward.

9 Claims, 19 Drawing Sheets

(56) References Cited

U.S. PATENT DOCUMENTS

| | | | |
|---|---|---|---|
| 9,042,094 B2 | 5/2015 | Williams et al. | |
| 9,426,908 B1* | 8/2016 | Hsiao | G11B 33/08 |
| 9,823,714 B2* | 11/2017 | Yang | G06F 1/187 |
| 9,992,904 B2 | 6/2018 | Chen et al. | |
| 2002/0050552 A1 | 5/2002 | Resnikov et al. | |
| 2005/0068721 A1* | 3/2005 | Chen | G06F 1/184 |
| | | | 361/679.32 |
| 2006/0087762 A1* | 4/2006 | Ohishi | G11B 33/124 |
| | | | 360/99.13 |
| 2006/0130083 A1* | 6/2006 | Cheng | G11B 33/08 |
| | | | 720/651 |
| 2008/0157638 A1* | 7/2008 | Liu | G06F 1/187 |
| | | | 312/223.2 |
| 2008/0158810 A1* | 7/2008 | Liu | G06F 1/187 |
| | | | 361/679.33 |
| 2010/0187957 A1* | 7/2010 | Liang | G06F 1/187 |
| | | | 312/223.2 |
| 2011/0139952 A1* | 6/2011 | Chang | G06F 1/188 |
| | | | 248/309.1 |
| 2012/0145575 A1 | 6/2012 | Wen | |
| 2012/0218705 A1* | 8/2012 | Huang | G06F 1/187 |
| | | | 361/679.37 |
| 2013/0229766 A1* | 9/2013 | Williams | G06F 1/16 |
| | | | 361/679.33 |
| 2014/0022740 A1 | 1/2014 | Tsai et al. | |
| 2014/0139993 A1* | 5/2014 | Liu | G11B 33/124 |
| | | | 361/679.31 |
| 2015/0009619 A1 | 1/2015 | Yin | |
| 2015/0043153 A1 | 2/2015 | Zhang et al. | |
| 2015/0092340 A1* | 4/2015 | Jau | G11B 33/128 |
| | | | 361/679.39 |
| 2015/0293566 A1* | 10/2015 | Ehlen | G06F 1/187 |
| | | | 361/679.33 |
| 2016/0302322 A1* | 10/2016 | Chen | F16B 2/18 |
| 2017/0199551 A1* | 7/2017 | Van Dijke | G06F 1/182 |
| 2019/0075668 A1* | 3/2019 | Adrian | H05K 5/0021 |
| 2019/0325917 A1* | 10/2019 | Chang | G11B 33/124 |

* cited by examiner

PULL-OUT AIDING DEVICE AND CHASSIS-WALL MODULE WITH PULL-OUT AIDING FUNCTION

CROSS-REFERENCE TO RELATED APPLICATION

This application is a divisional patent application of U.S. application Ser. No. 15/381,589 filed on Dec. 16, 2016, which claims priority to Taiwanese Patent Application No(s). 104220885 filed on Dec. 25, 2015, the entire contents of which are hereby incorporated by reference for which priority is claimed under 35 U.S.C. § 120.

FIELD OF THE INVENTION

The present invention relates to a pull-out aiding device and a chassis-wall module with pull-out aiding function. The pull-out aiding device can be assembled to a chassis, a cabinet, an enclosure and the like to help a user conveniently pull out a corresponding apparatus, such as a hard disk, from the chassis, the cabinet or the enclosure.

BACKGROUND OF THE INVENTION

A conventional chassis is usually provided with an unloading mechanism, which is also referred to as a card ejection mechanism. The function of the unloading mechanism is to separate a hard disk or a circuit board from a connection port arranged in the chassis. When a user turns the unloading mechanism, the hard disk or the circuit board is pushed forward and accordingly becomes separated from the connection port. However, the unloading mechanism of the conventional chassis can only move the hard disk or the circuit board by a relatively small distance, which is usually in the range of 3 mm to 5 mm. Being hindered by partitioning walls of the chassis or other apparatus parallelly arranged at two sides of the chassis, the user often could not easily or conveniently remove the ejected card from the chassis.

SUMMARY OF THE INVENTION

A primary object of the present invention is to overcome the disadvantage of the conventional chassis by providing a pull-out aiding device that can be easily, effortlessly and conveniently operated to pull out an apparatus from the chassis.

To achieve the above and other objects, the pull-out aiding device provided according to the present invention is configured for mounting on an object, which includes a first partitioning wall and a second partitioning wall located opposite to each other. In the object, a corresponding apparatus can be mounted. The pull-out aiding device includes a pulling member and a handle member. The pulling member is movably coupled with the first partitioning wall and includes a first pivot section and an abutting section. The handle member includes a second pivot section and an operating section. The second pivot section is pivotally connected to the first pivot section, such that the handle member is turnable about the second pivot section.

The handle member of the pull-out aiding device also includes a pressing section, which has a closing edge and a pulling-out edge. A vertical distance between the pulling-out edge and the second pivot section can be larger than, equal to or smaller than a vertical distance between the closing edge and the second pivot section The handle member of the pull-out aiding device is turnable about the second pivot section between a closed position and a pulled-out position. The closing edge is in contact with or located adjacent to the first partitioning wall when the handle member is in the closed position, and the pulling-out edge is in contact with or located adjacent to the first partitioning wall when the handle member is in the pulled-out position. And, the abutting section of the pulling member is moved forward relative to the first partitioning wall by a pulling distance when the handle member is in the pulled-out position.

The pulling member of the pull-out aiding device can include a bent section, and the bent section is located adjacent to the first pivot section and inclined toward the first partitioning wall by 2 to 90 degrees.

The pulling member of the pull-out aiding device can be provided with a male foolproof retainer or a female foolproof retainer.

According to the present invention, the first partitioning wall is provided with a guide rail unit, to which the pulling member is movably coupled.

The pull-out aiding device according to the present invention further includes a releasable fastening element, which is movably connected to the operating section of the handle member and includes a latch for engaging with a latch hole provided on the second partitioning wall.

The pull-out aiding device according to the present invention can further include a shock-absorbing member, which is disposed on one side of the handle member facing toward the corresponding apparatus.

According to the pull-out aiding device of the present invention, the first pivot section and the second pivot section can be pivotally turnably connected to or engaged with each other via a shaft.

The pull-out aiding device according to the present invention can further include an elastic element, which is fitted on the shaft, the pulling member or the handle member to elastically press against the pulling member or the handle member.

The pulling member of the pull-out aiding device is provided with a first limiting unit and the first partitioning wall is provided with a second limiting unit. The first and the second limiting unit interfere with each other when the handle member is in the pulled-out position.

According to an embodiment of the present invention, the first limiting unit is an elongated hole or an elongated slot and the second limiting unit is a protruded body, a hooked body or a fastening body adapted to be correspondingly received in the elongated hole or the elongated slot of the first limiting unit.

According to another embodiment of the present invention, the second limiting unit is an elongated hole or an elongated slot and the first limiting unit is a protruded body, a hooked body or a fastening body adapted to be correspondingly received in the elongated hole or the elongated slot of the second limiting unit.

According to an embodiment of the present invention, the first limiting unit includes two flanged bosses and the second limiting unit includes two quick-release guide rails adapted to associate with the two flanged bosses of the first limiting unit in a one-to-one correspondence.

According to the above embodiment, the flanged bosses respectively have a body portion and a flange portion formed around a free end of the body portion and the quick-release guide rails respectively have a rail portion and a quick-release hole portion communicable with the rail portion. The body portions of the flanged bosses are separately movably received in the corresponding rail portions; the flange portions of the flanged bosses have a diameter larger than a diameter of the body portions and a width of the rail portions; and the diameter of the flange portions is smaller than a diameter of the quick-release hole portions.

According to the above embodiment, a distance between the two flanged bosses is larger than a distance between the two quick-release hole portions of the two quick-release guide rails.

According to another embodiment of the present invention, the first limiting unit is in the form of a guide rod and located at an end of the pulling member having the first pivot section formed thereat, the second limiting unit is in the form of a supporting seat provided with a guide rail, and the guide rod is engaged with the guide rail to move in along a path defined by the guide rail.

According to an embodiment of the present invention, the handle member includes a limiting section, which is located adjacent to the closing edge of the pressing section, and the first partitioning wall is correspondingly provided with a mating limiting section. The limiting section is adapted to limit the mating limiting section to stop the handle member from moving relative to the first partitioning wall.

According to an embodiment of the present invention, the abutting section of the pulling member is provided with a retaining hole and the corresponding apparatus is provided with a projected interfering section corresponding to the retaining hole; and the retaining section is adapted to engage with the interfering section.

According to an embodiment of the present invention, the handle member includes a return hook, which is arranged at an end of the handle member having the second pivot section formed thereat.

To achieve the above and other objects, the present invention also provides a pull-out aiding device for mounting to an object, which includes a first partitioning wall and is configured to match a corresponding apparatus. The pull-out aiding device includes a pulling member and a handle member. The pulling member includes a first coupling section and an abutting section, and the abutting section is configured to move the corresponding apparatus. The handle member includes a rotation shaft portion, a second coupling section and an operating section. The second coupling section and the first coupling section are connected together while they are movable relative to each other. The handle member is turnable about the rotation shaft portion; and the rotation shaft portion is movably associated with the first partitioning wall.

According to an embodiment of the present invention, the second coupling section of the pull-out aiding device is a hole and the first coupling section can be any one of a protruded body, a hook, a recessed body and a fastening body adapted to extend through the hole of the second coupling section.

According to another embodiment of the present invention, the second coupling section is in the form of a hook, and the first coupling section can be any one of a hook, a hole, a protruded body, a recessed body and a fastening body adapted to engage with the hook of the second coupling section.

With the above arrangements, the pull-out aiding device and the chassis-wall module according to the present invention can be easily and effortlessly operated to help a user conveniently remove a corresponding apparatus from a chassis.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
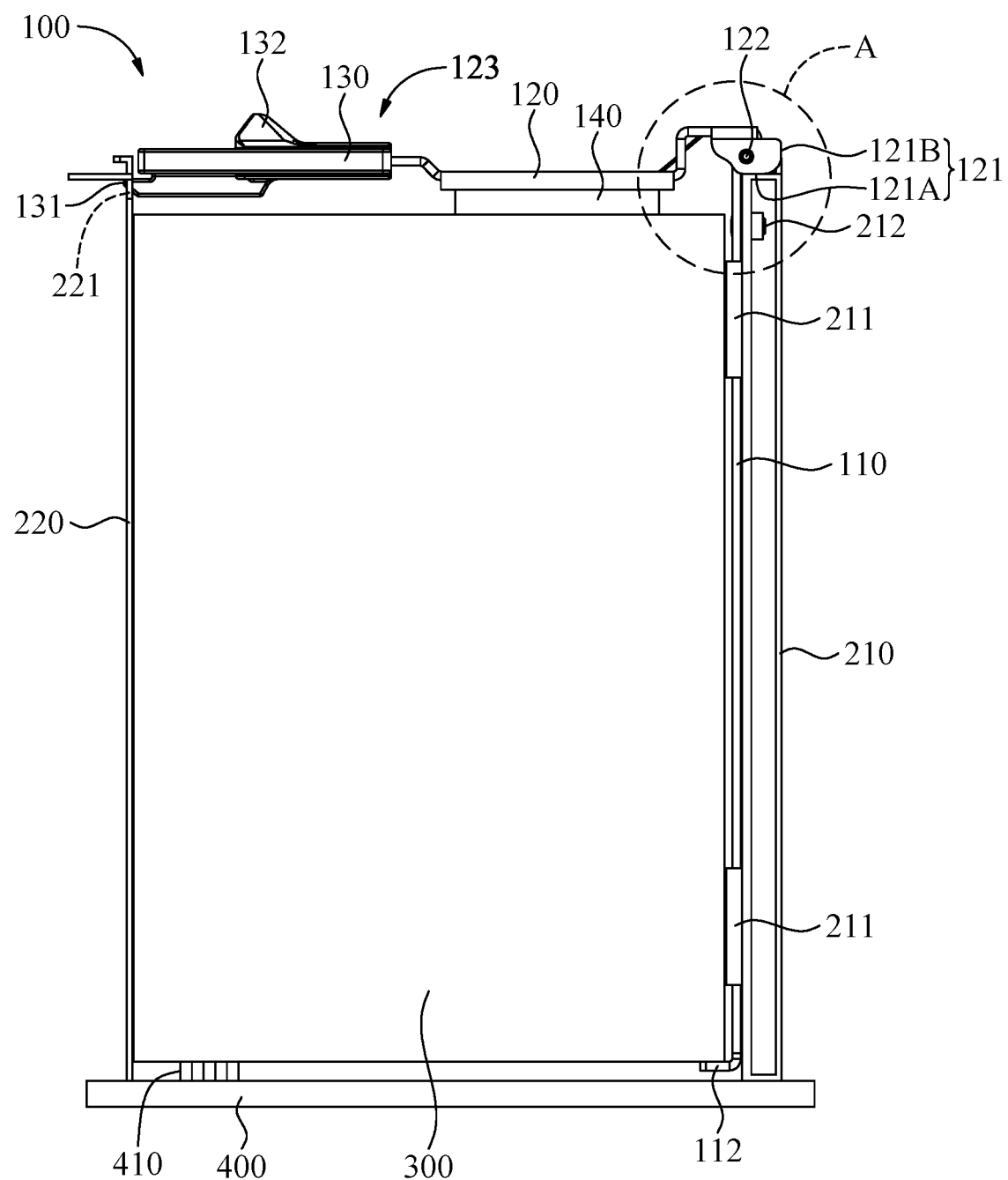
FIG. 1 is a schematic view showing a pull-out aiding device according to a first embodiment of the present invention and a corresponding apparatus to be pulled out with the pull-out aiding device.

The present invention will now be described with some preferred embodiments thereof and by referring to the accompanying drawings. For the purpose of easy to understand, elements that are the same in the preferred embodiments are denoted by the same reference numerals.

Figure 2:
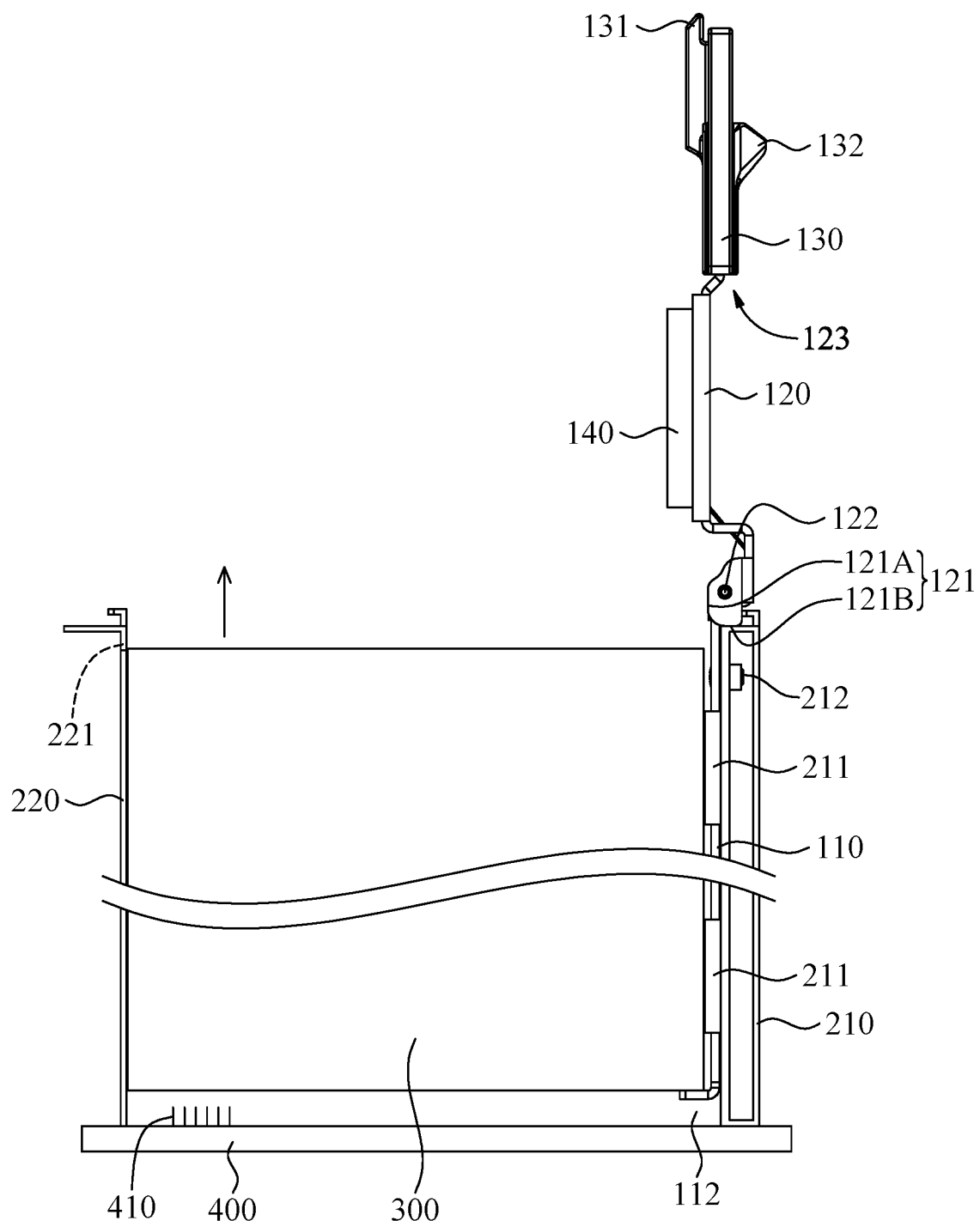
FIG. 2 is a schematic view showing a handle member of the pull-out aiding device of FIG. 1 in a pulled-out position.
Figure 3:
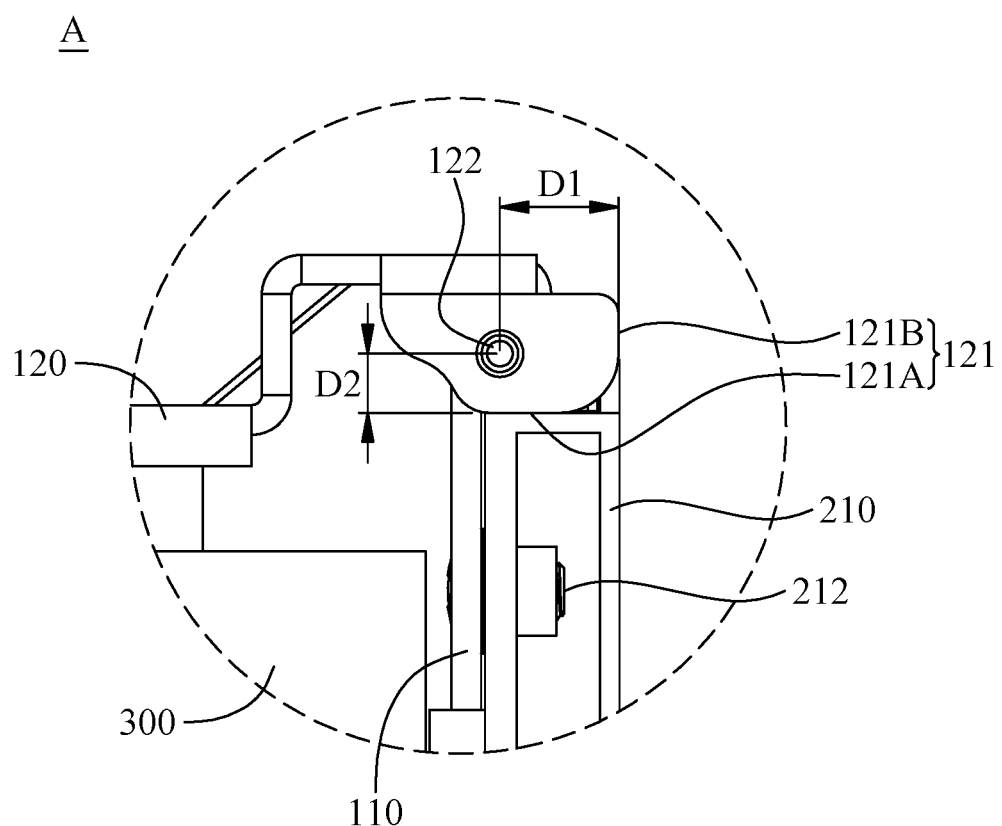
FIG. 3 is an enlarged view of the circled area A of FIG. 1.

Please refer to FIGS. 1 to 3. A pull-out aiding device 100 according to a first embodiment of the present invention is configured for mounting on an object, which includes a first partitioning wall 210 or/and a second partitioning wall 220 located opposite to each other. In the object, a corresponding apparatus 300, such as a hard disk, can be mounted. The object also includes a top wall and a bottom wall (not shown), which are connected to the first and the second partitioning wall 210, 220. That is, the first partitioning wall 210, the second partitioning wall 220, the top wall and the bottom wall together define a receiving space, in which the corresponding apparatus 300 is received, and an opening communicating with the receiving space. A circuit board 400 is arranged in the receiving space and has a connection port 410 provided thereon for connecting to a corresponding connection jack (not shown) on the corresponding apparatus 300, such as a hard disk.

The object can be, for example, a chassis, a drawer, a hole, a recess, a cover or a wall panel.

The pull-out aiding device 100 includes a pulling member 110 and a handle member 120. The pulling member 110 is movably coupled with the first partitioning wall 210, and includes a first pivot section 111 (see FIG. 4) and an abutting section 112, which are located at two opposite ends of the pulling member 110. The abutting section 112 is abutted against the corresponding apparatus 300 for pushing the latter forward. The handle member 120 includes a pressing section 121, a second pivot section 122 and an operating section 123. The second pivot section 122 is located adjacent to the pressing section 121 and pivotally connected to the first pivot section 111, such that the handle member 120 is turnable about the second pivot section 122 to move between a closed position, as shown in FIG. 1, and a pulled-out position, as shown in FIG. 2. The pressing section 121 has a closing edge 121A and a pulling-out edge 121B. As shown in FIG. 3, a vertical distance D1 between the pulling-out edge 121B and the second pivot section 122 is larger than a vertical distance D2 between the closing edge 121A and the second pivot section 122. However, it is not necessary for the vertical distance D1 to be larger than the vertical distance D2. In other possible arrangements, the vertical distance D1 between the pulling-out edge 121B and the second pivot section 122 can be equal to or smaller than the vertical distance D2 between the closing edge 121A and the second pivot section 122.

When the handle member 120 is in the closed position, the closing edge 121A is in contact with or located adjacent to the first partitioning wall 210. When the handle member 120 is in the pulled-out position, the pulling-out edge 121B is in contact with or located adjacent to the first partitioning wall 210 and the abutting section 112 is moved forward relative to the first partitioning wall 210 by a pulling distance, which has relation to the vertical distance D1 between the pulling-out edge 121B and the second pivot section 122 and the vertical distance D2 between the closing edge 121A and the second pivot section 122. The pulling distance can be in the range of, for example, 0.5 mm to 500 mm.

In the first embodiment, when the handle member 120 is in the closed position, it is located perpendicular or non-parallel to the first partitioning wall 210. On the other hand, when the handle member 120 is in the pulled-out position, it is located in parallel or non-perpendicular to the first partitioning wall 210.

As can be seen in FIGS. 1 and 2, the abutting section 112 is in the form of an L-shaped arm for abutting against, for example, a rear side of the corresponding apparatus 300. When the pulling member 110 is moved forward, the abutting section 112 also pushes the corresponding apparatus 300 forward. However, it is understood the abutting section 112 is not necessarily limited to the L-shaped arm but can be other differently shaped structures, such as a hook, a latch or a stepped structure.

In the first embodiment, the first partitioning wall 210 is provided on one side facing the second partitioning wall 220 with a guide rail unit 211, to which the pulling member 110 is movably coupled, so that the pulling member 110 can be moved relative to the first partitioning wall 210 in a direction away from the circuit board 400 and toward the opening of the object.

When the handle member 120 is operated to turn from the closed position to the pulled-out position, since the vertical distance D1 between the pulling-out edge 121B of the pressing section 121 and the second pivot section 122 is larger than the vertical distance D2 between the closing edge 121A of the pressing section 121 and the second pivot section 122, the pulling member 110 is brought by the handle member 120 to move outward relative to the first partitioning wall 210. At this point, the abutting section 112 pushes the corresponding apparatus 300 forward to thereby separate the latter from the connection port 410 and bring a front side of the corresponding apparatus 300 to extend beyond the first and the second partitioning wall 210, 220. Then, the handle member 120 can be further outward pulled by a predetermined distance for the corresponding apparatus 300 to expose more from the opening of the object and a user can conveniently remove the corresponding apparatus 300 from the object with one hand.

Figure 4:
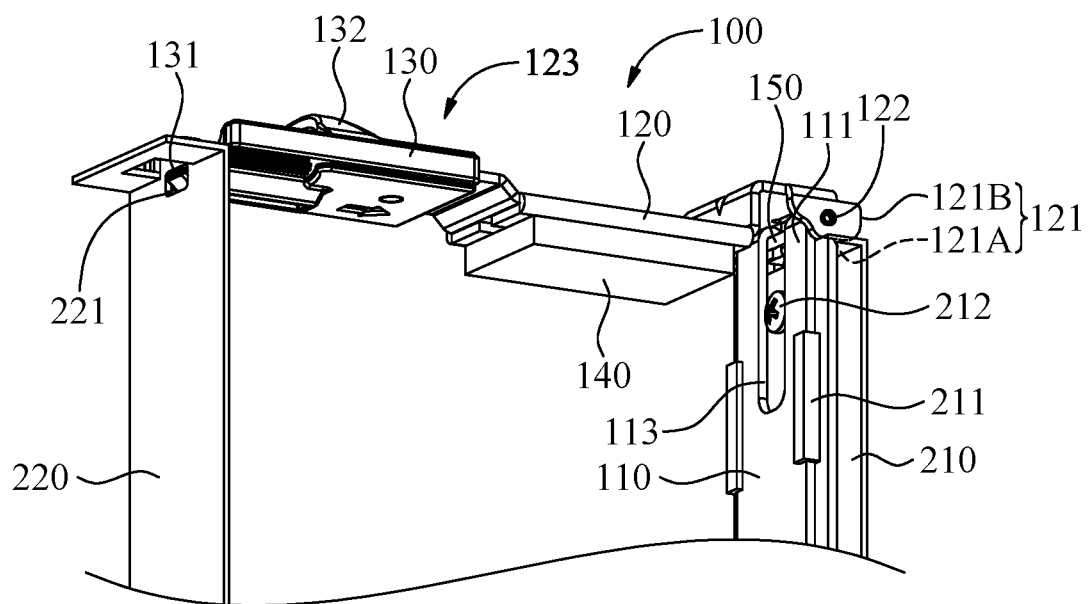
FIG. 4 is a fragmentary perspective view of the pull-out aiding device of FIG. 1.

Please refer to FIG. 4. The first pivot section 111 and the second pivot section 122 are pivotally turnably connected to each other via a shaft 150. However, it is understood the first and the second pivot section 111, 122 can be otherwise connected together via a hinge structure or be engaged with each other via an engaging structure.

The pulling member 110 is provided with a first limiting unit 113. When the handle member 120 is located at the pulled-out position, the first limiting unit 113 interferes with a second limiting unit 212 provided on the first partitioning wall 210 to limit a maximum length by which the pulling member 110 can be pulled out beyond the first partitioning wall 210. In the first embodiment, the first limiting unit 113 is an elongated hole, and the second limiting unit 212 is a protruded body adapted to be correspondingly received in the above-mentioned elongated hole. In practical implementation of the present invention, the protruded body can be a screw, a nut or a rivet locked to the first partitioning wall 210. It is understood the first limiting unit 113 and the second limiting unit 212 are not necessarily limited to the above-described structure. For example, the first limiting unit 113 can be otherwise an elongated slot, while the second limiting unit 212 can be a hooked body adapted to be correspondingly received in the elongated slot. Alternatively, the second limiting unit 212 can be an elongated hole or an elongated slot, while the first limiting unit 113 can be a protruded body or a hook adapted to be correspondingly received in the elongated hole or the elongated slot.

The pull-out aiding device 100 can further include a shock-absorbing member 140, which is disposed on one side of the handle member 120 facing toward the corresponding apparatus 300 to avoid impact of the handle member 120 on the corresponding apparatus 300. The shock-absorbing member 140 can be, for example, a piece of foam rubber, sponge or other similar soft material or elastomer.

Figure 5:
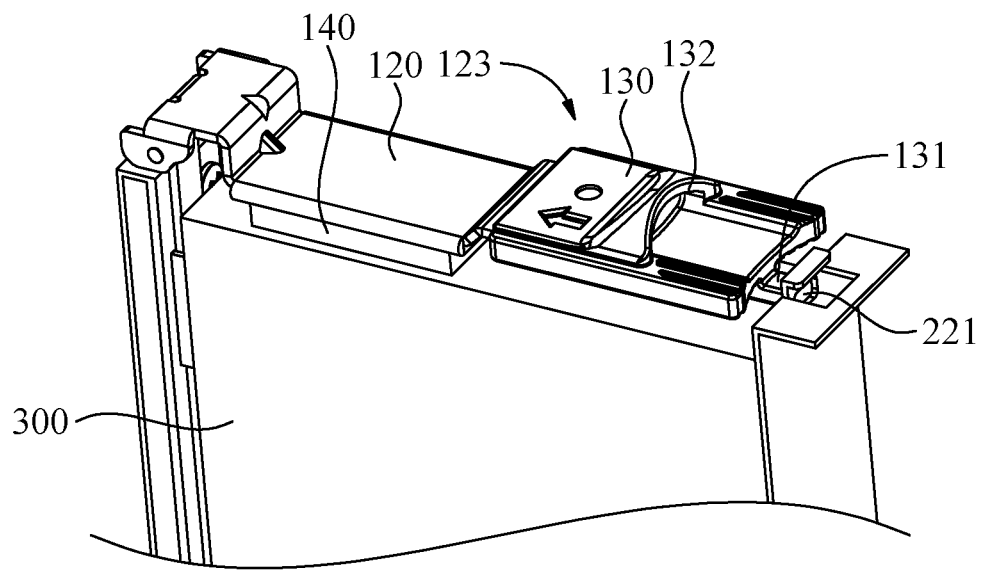
FIG. 5 is another fragmentary perspective view of the pull-out aiding device of FIG. 1.

As can be seen in FIGS. 4 and 5, the pull-out aiding device 100 can further include a releasable fastening element 130, which is movably connected to the operating section 123 of the handle member 120. The releasable fastening element 130 includes a latch 131 for engaging with a latch hole 221 provided on the second partitioning wall 220 to hold the handle member 120 to the closed position. Also, the releasable fastening element 130 can include a grip portion 132 that is raised from an outer surface of the releasable fastening element 130.

In the illustrated first embodiment, the pulling member 110 or the handle member 120 can be made of a metal material or a plastic material.

Figure 6:
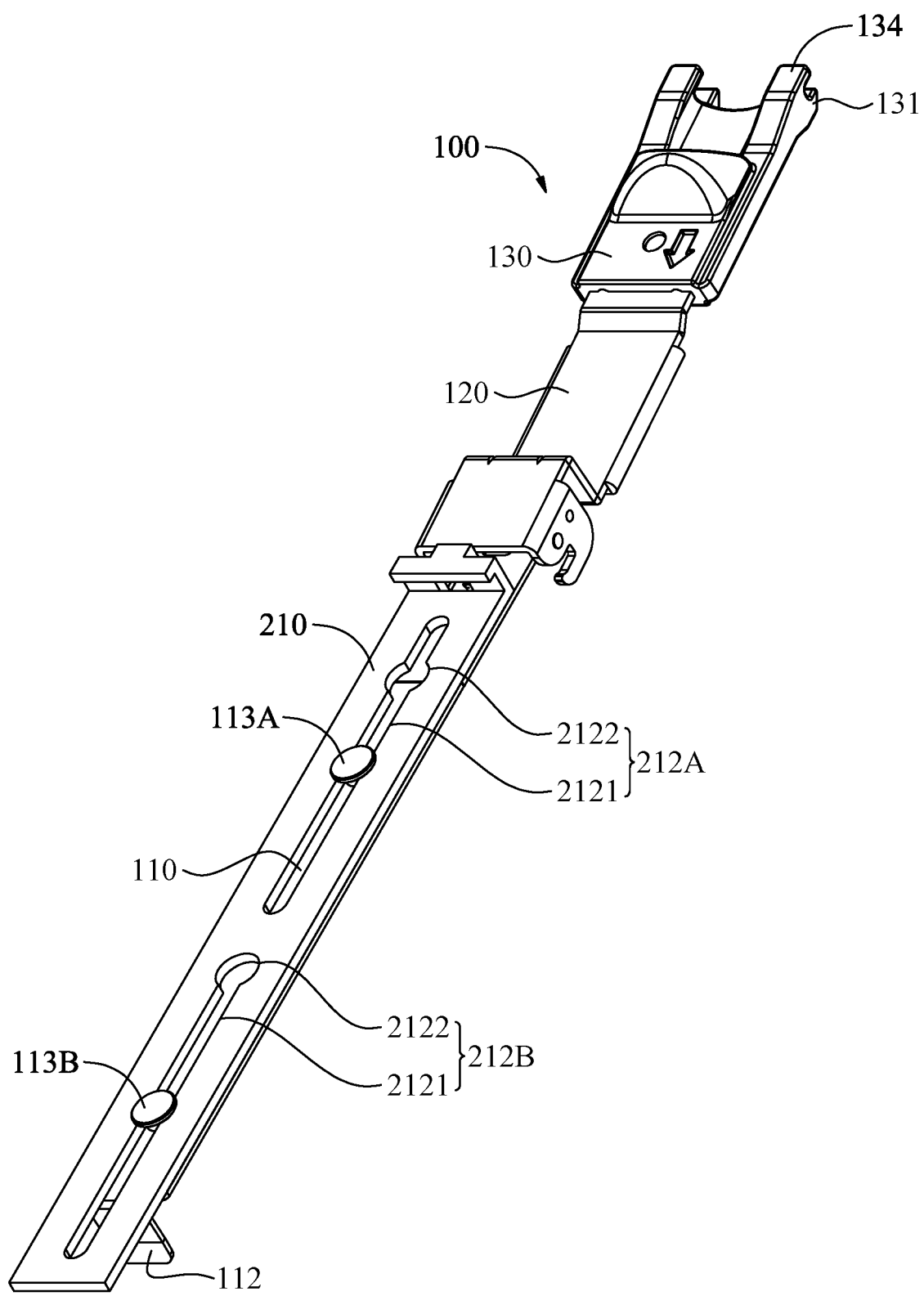
FIG. 6 is an assembled perspective view showing first and second limiting units for a first variation of the pull-out aiding device according to the first embodiment of the present invention.
Figure 7:
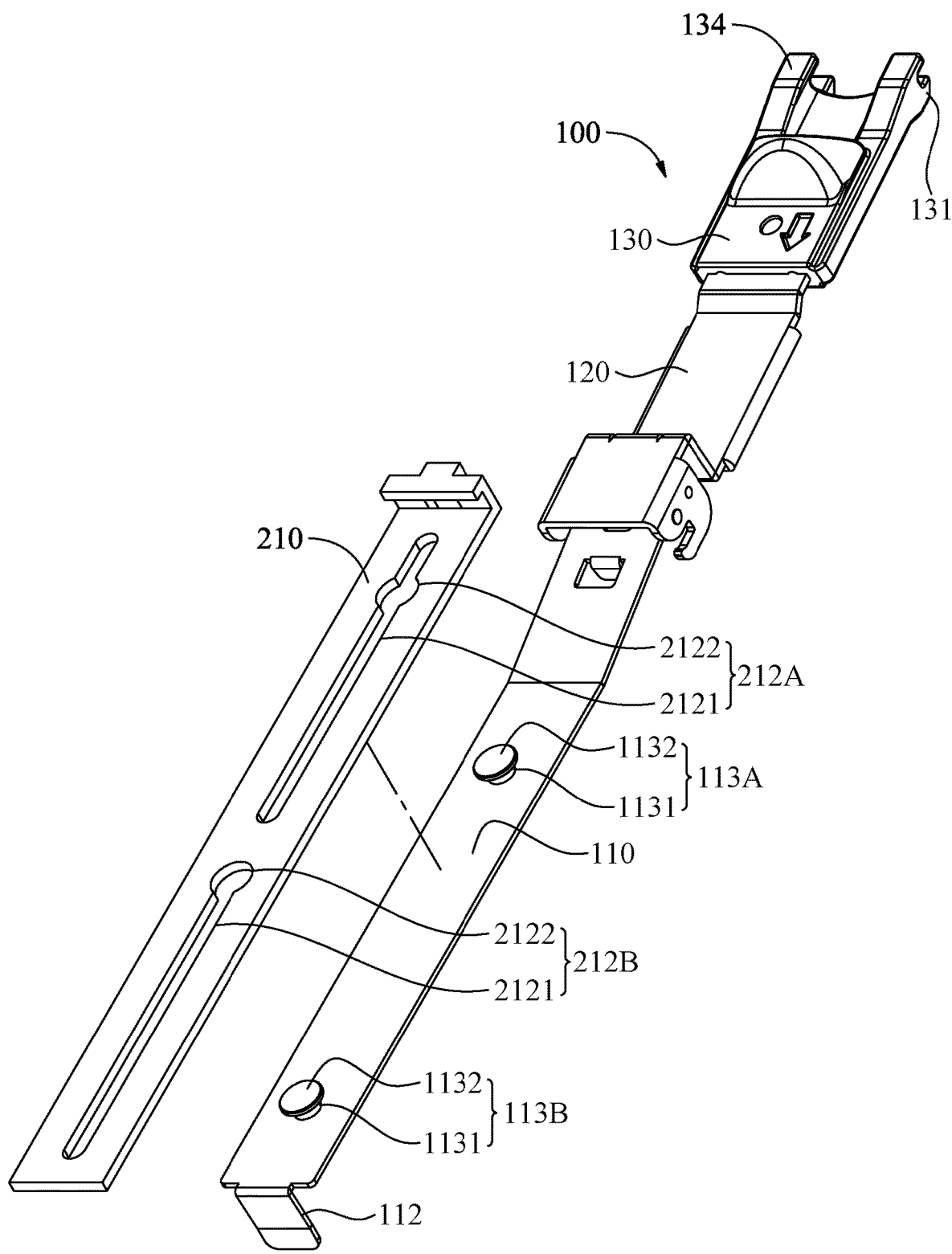
FIG. 7 is an exploded view of FIG. 6.

Please refer to FIGS. 6 and 7, in which the first and second limiting units for a first variation of the pull-out aiding device 100 are shown. According to the first variation, the first limiting unit 113 includes two flanged bosses 113A, 113B, and the second limiting unit 212 includes two quick-release guide rails 212A, 212B that are associated with the two flanged bosses 113A, 113B in a one-to-one correspondence. As can be seen in FIGS. 6 and 7, the two flanged bosses 113A, 113B are movable in along the corresponding quick-release guide rails 212A, 212B.

In addition, the releasable fastening element 130 can have more than one latch 131. In the illustrated first variation of the first embodiment, there are shown two latches 131. Correspondingly, the second partitioning wall 220 can be provided with more than one latch hole 221 (not shown in FIGS. 6 and 7) for the latches 131 to engage with. The releasable fastening element 130 further has two locating stoppers 134, which are adapted to abut against a front edge of the second partitioning wall 220, so that the releasable fastening element 130 and the second partitioning wall 220 are held in place relative to each other.

Figure 8:
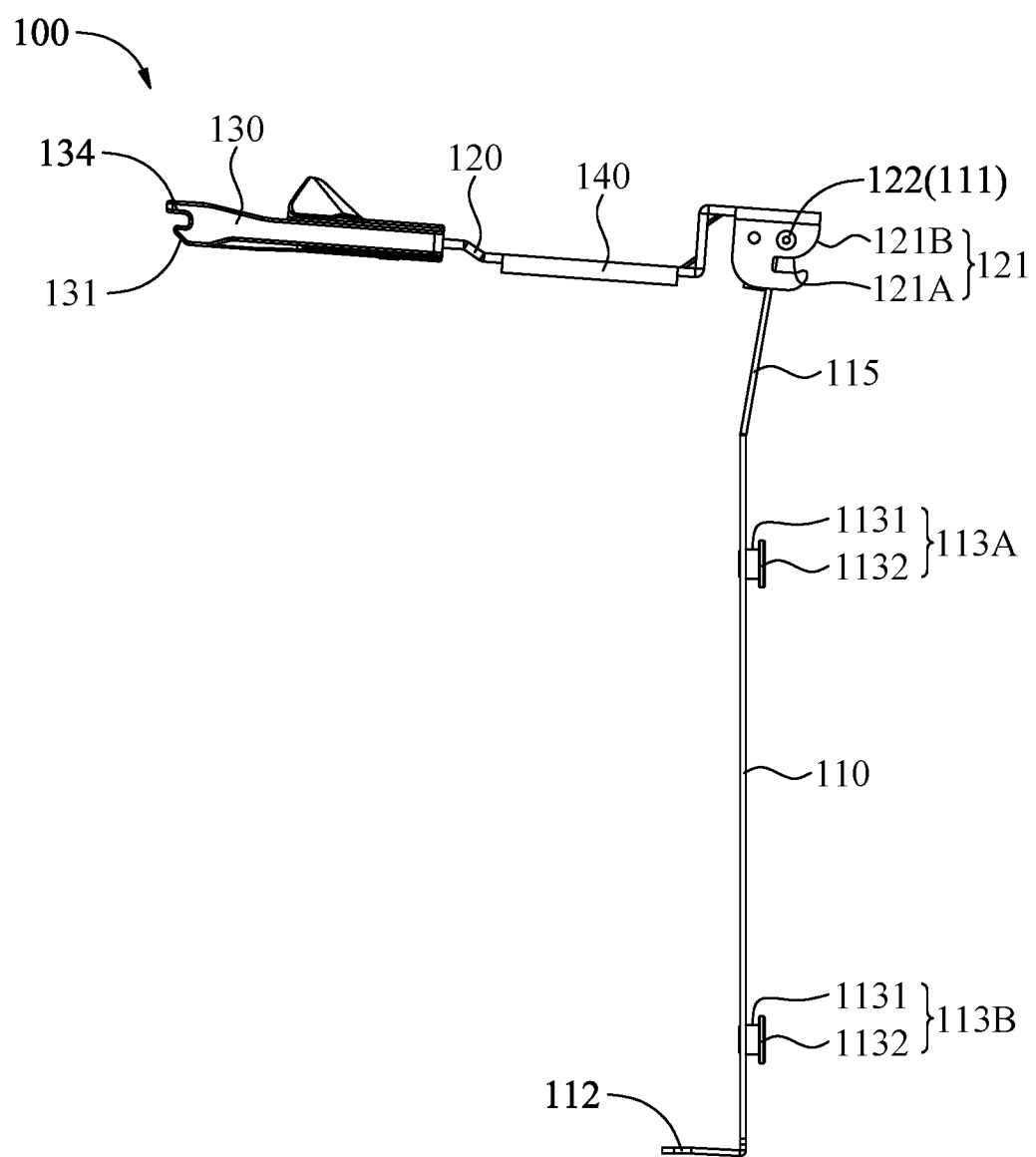
FIG. 8 is a side view showing the first limiting unit for the first variation of the pull-out aiding device according to the first embodiment of the present invention.

Please refer to FIGS. 6, 7 and 8. In the first variation of the first embodiment, the flanged bosses 113A, 113B respectively have a body portion 1131 and a flange portion 1132 formed around a free end of the body portion 1131. The quick-release guide rails 212A, 212B respectively have a rail portion 2121 and a quick-release hole portion 2122 communicable with the rail portion 2121. The body portions 1131 of the flanged bosses 113A, 113B are separately movably received in the corresponding rail portions 2121. The flange portions 1132 of the flanged bosses 113A, 113B have a diameter larger than a diameter of the body portions 1131 and a width of the rail portions 2121, so that the flanged bosses 113A, 113B are limited to move only within the corresponding rail portions 2121. Also, the diameter of the flange portions 1132 is smaller than a diameter of the quick-release hole portions 2122. When the flanged bosses 113A, 113B are moved in the rail portions 2121 to positions corresponding to the quick-release hole portions 2122, the flange portions 1132 can be moved out of the quick-release hole portions 2122, allowing the pull-out aiding device 100 to be detached from the first partitioning wall 210.

Figure 9:
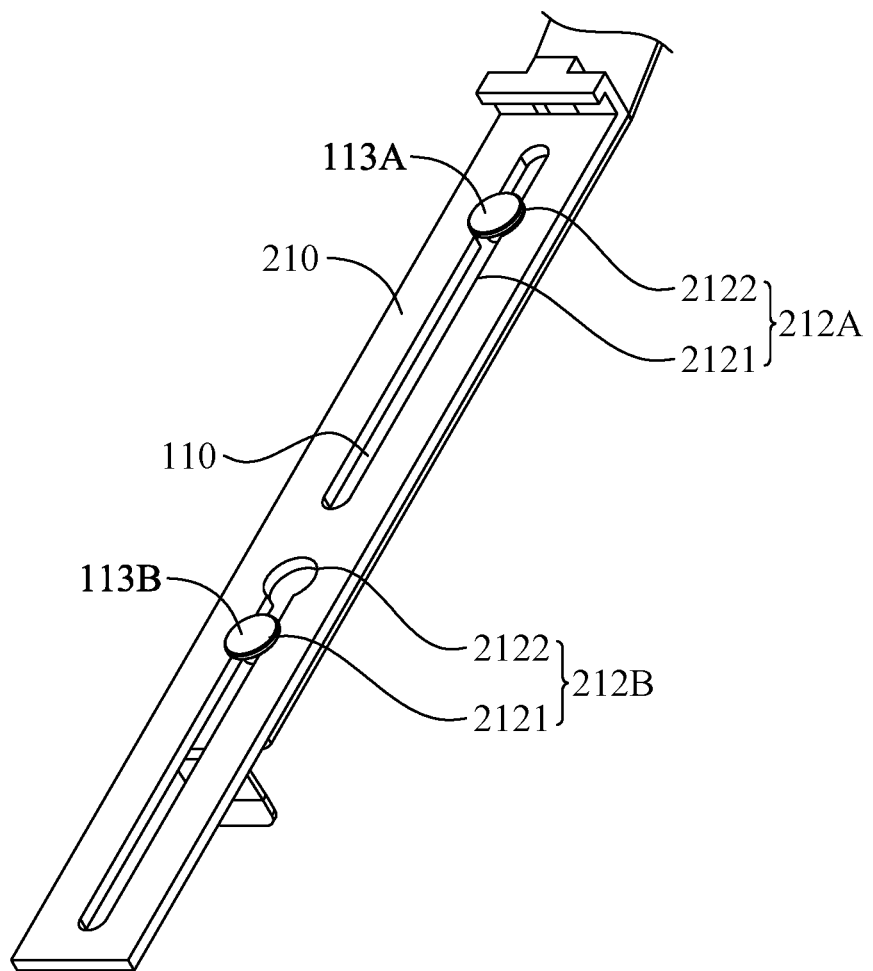
FIG. 9 shows how the first and second limiting units of FIG. 6 work to limit the movement of the pull-out aiding device.
Figure 10:
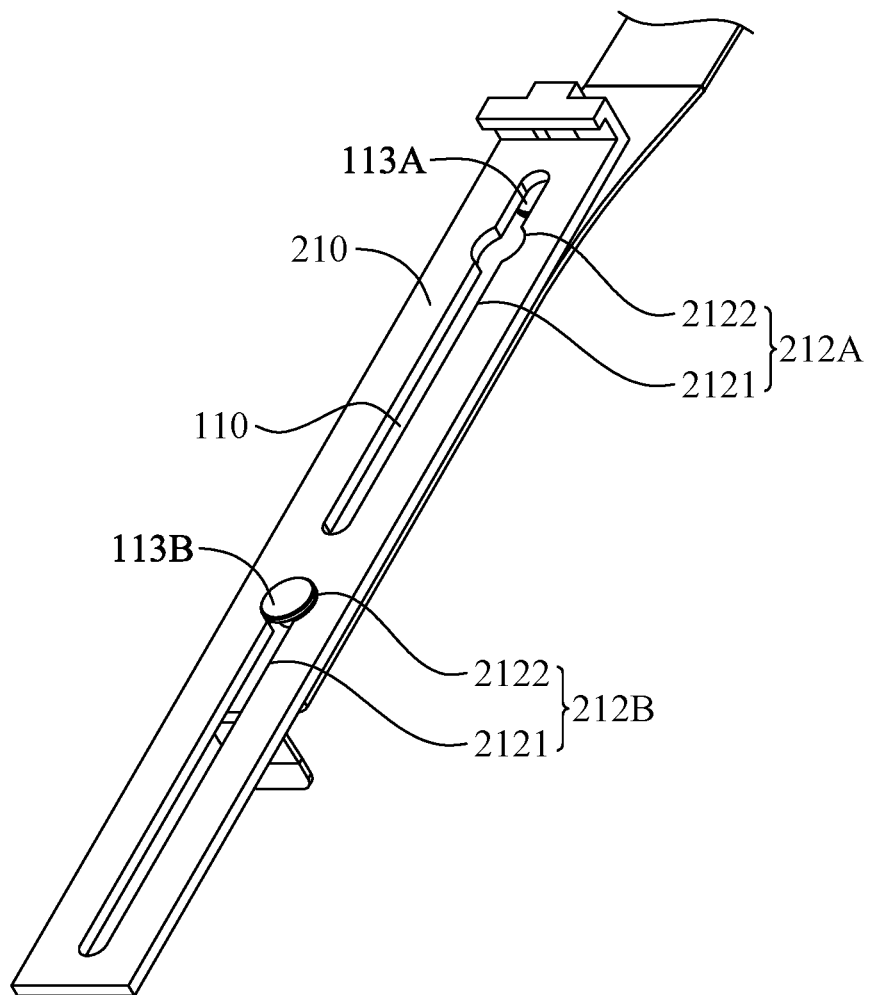
FIG. 10 is another view showing how the first and second limiting units of FIG. 6 work to limit the movement of the pull-out aiding device.

Further, a distance between the two flanged bosses 113A, 113B is larger than a distance between the two quick-release hole portions 2122 of the two quick-release guide rails 212A, 212B. Therefore, as shown in FIGS. 9 and 10, the two flanged bosses 113, 113B would not simultaneously disengage from the two quick-release guide rails 212A, 212B. Preferably, on the quick-release guide rail 212B, the quick-release hole portion 2122 is arranged at a front end of the rail portion 2121, i.e. a point on the quick-release guide rail 212B that is closest to the second pivot section 122; and on the quick-release guide rail 212A, the quick-release hole portion 2122 is arranged at a point on the rail portion 2121 that is located behind the front end of the rail portion 2121 by a predetermined distance. Accordingly, when the pulling member 110 is pulled outward relative to the first partitioning wall 210, the flanged boss 113A will reach at the quick-release hole portion 2122 of the quick-release guide rail 212A first, allowing the flange portion 1132 of the flanged boss 113A to move out of the quick-release hole portion 2122 of the quick-release guide rail 212A. Thereafter, when the pulling member 110 is further pulled outward for the flanged boss 113B to reach at the quick-release hole portion 2122 of the quick-release guide rail 212B, the flange portion 1132 of the flanged boss 113B can be easily disengaged from the quick-release hole portion 2122 of the quick-release guide rail 212B, allowing the pull-out aiding device 100 to be fully detached from the first partitioning wall 210.

Figure 11:
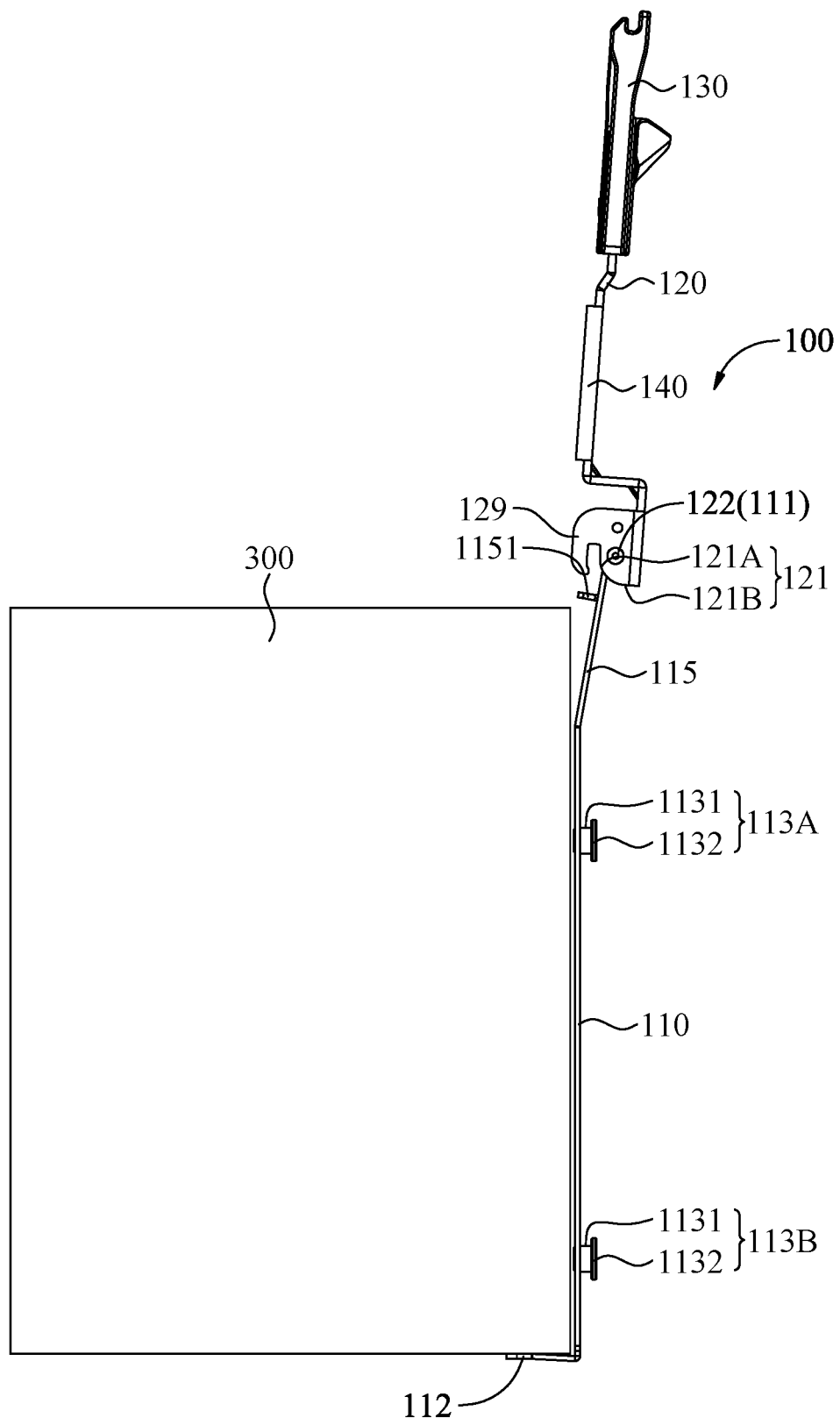
FIG. 11 is a schematic view showing a pulling member of the pull-out aiding device according to the first embodiment of the present invention includes a bent section.

As can be seen in FIG. 11, the pulling member 110 can have a bent section 115, which is located adjacent to the first pivot section 111 and inclined toward the first partitioning wall 210 by 2 to 90 degrees. The bent section 115 is provided with a male foolproof retainer 1151 for ensuring correct mounting of the corresponding apparatus 300 in the object. That is, when the corresponding apparatus 300 is correctly mounted, the abutting section 112 and the foolproof retainer 1151 are pressed against two opposite end surfaces of the corresponding apparatus 300. On the other hand, in the case the corresponding apparatus 300 is not correctly mounted in the object, the foolproof retainer 1151 interferes with the corresponding apparatus 300 and the pull-out aiding device 100 could not be pushed into the object. And, when the pulling member 110 has not yet been pulled outward, the bent section 115 is pushed by the first partitioning wall 210 against the corresponding apparatus 300 and is accordingly located in parallel to the first partitioning wall 210. On the other hand, when the pulling member 110 is outward pulled relative to the first partitioning wall 210 and the bent section 115 is exposed from the object, the bent section 115 automatically inclines outward relative to the corresponding apparatus 300 and the foolproof retainer 1151 does not hinder the removal of the corresponding apparatus 300 from the object, allowing the corresponding apparatus 300 to be pulled out smoothly.

According to the present invention, the whole handle member 120 can be made of a plastic material and can have a window formed thereon. Via the window, the corresponding apparatus 300 can be seen from outside of the pull-out aiding device 100.

As shown in FIG. 6, the releasable fastening element 130 can be configured to have two latches 131 and two locating stoppers 134. The locating stoppers 134 are adapted to abut against a front edge of the second partitioning wall 220 and thereby hold the releasable fastening element 130 and the second partitioning wall 220 in place relative to each other. In the illustrated first variation of the first embodiment, the releasable fastening element 130 is connected to the operating section 123 via a plurality of compression springs.

Please refer back to FIG. 4. The shaft 150 mounted between the first pivot section 111 of the pulling member 110 and the second pivot section 122 of the handle member 120 has an elastic element fitted thereon. The elastic element elastically presses against the pulling member 110 and the handle member 120, such that the handle member 120, once being opened, can be automatically turned by the elastic element to restore to its original position. The elastic element can be a helical spring, a torsion spring, an elastic cylinder or a sheet spring.

As can be seen in FIG. 11, the handle member 120 can further include a return hook 129, which can be arranged at an end of the handle member 120 having the second pivot section 122 formed thereat. Meanwhile, the first partitioning wall 210 is correspondingly provided with a return hook hole (not shown), to which the return hook 129 is hooked when the handle member 120 is closed.

Figure 12:
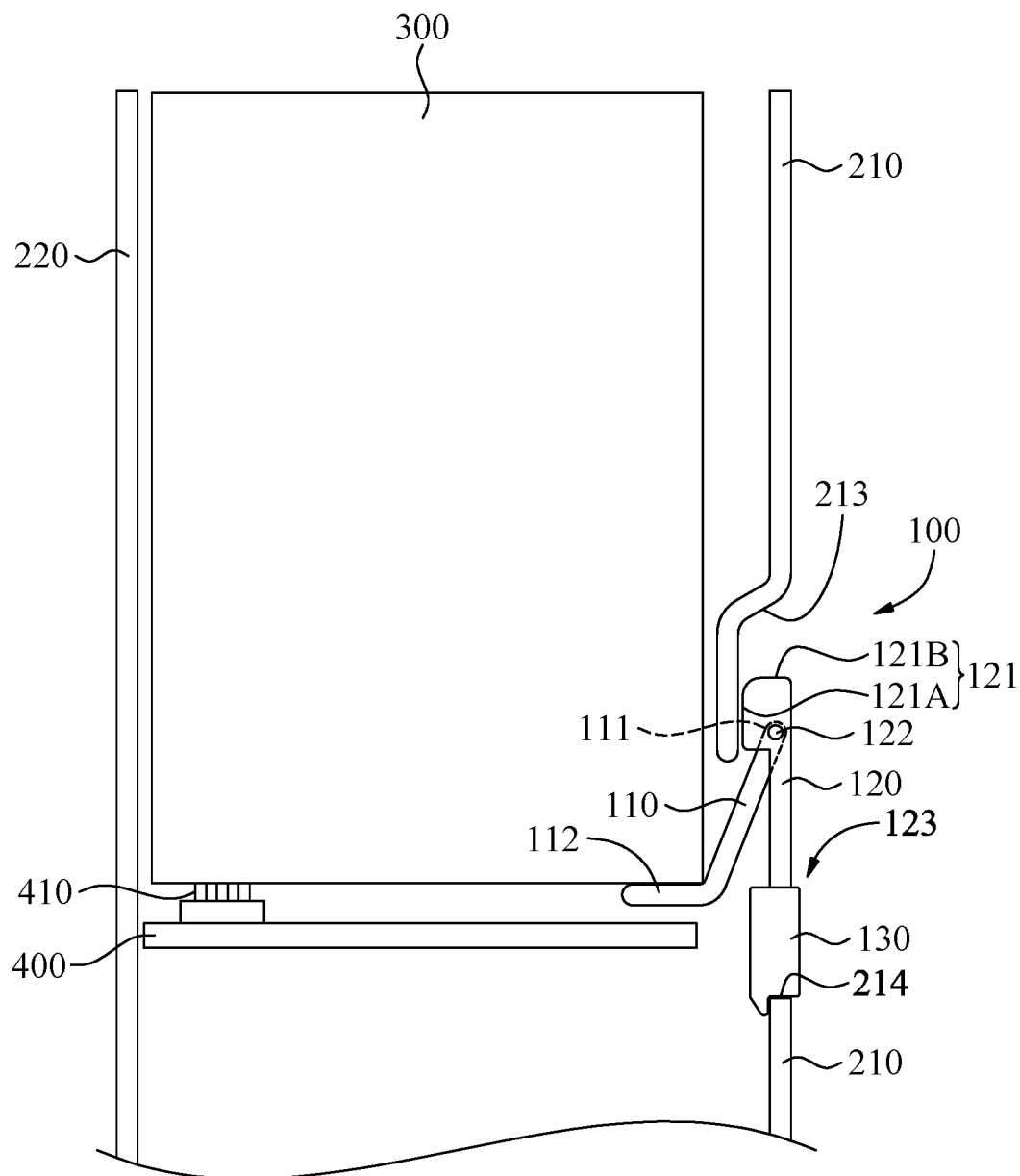
FIG. 12 is a schematic view showing a pull-out aiding device according to a second embodiment of the present invention and a corresponding apparatus to be pulled out with the pull-out aiding device.
Figure 13:
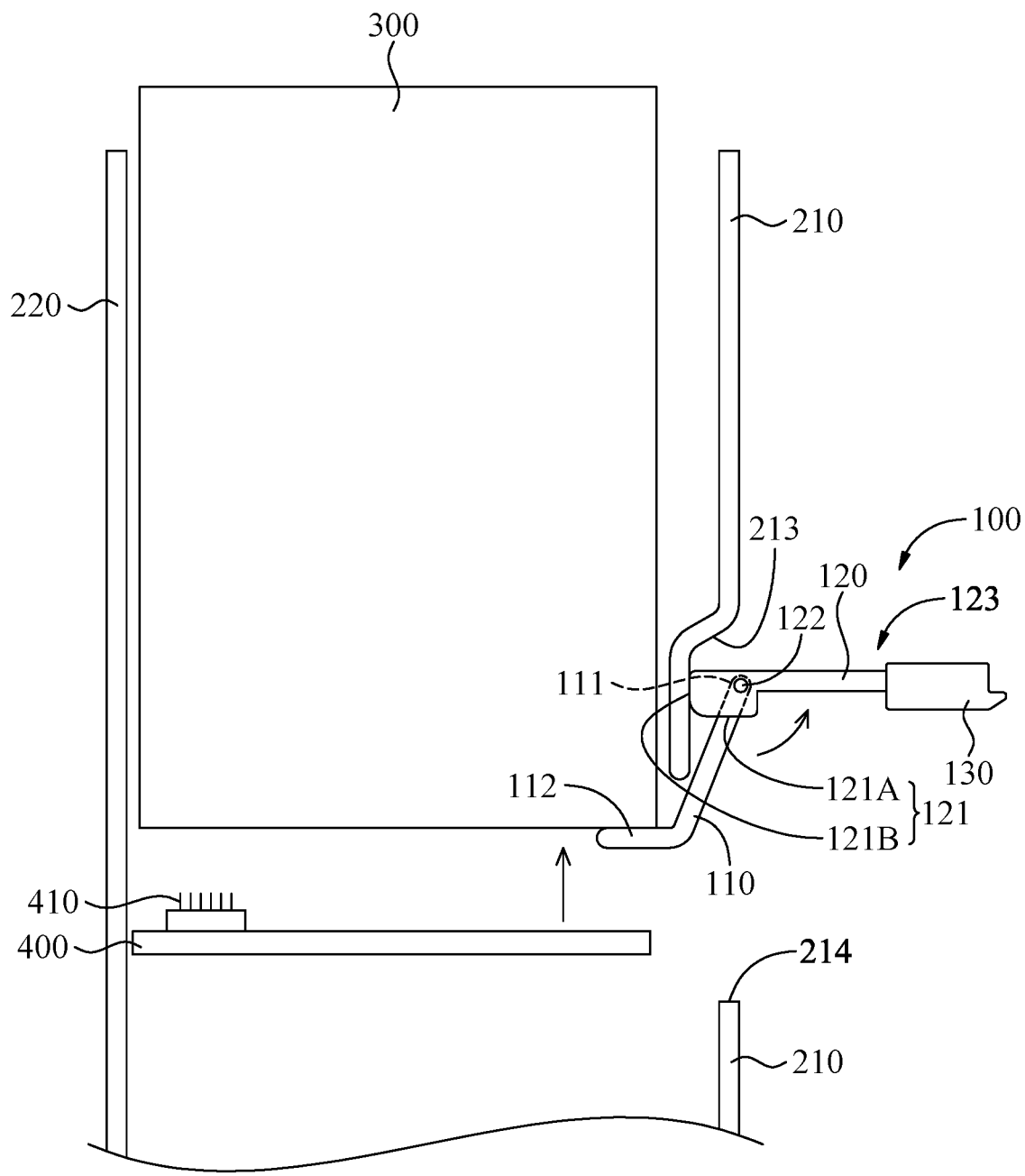
FIG. 13 is a schematic view showing a handle member of the pull-out aiding device of FIG. 12 in a pulled-out position.

Please refer to FIGS. 12 and 13, in which a pull-out aiding device 100 according to a second embodiment of the present invention is shown. Unlike the pull-out aiding device 100 of the first embodiment, of which the handle member 120 is located corresponding to the opening of the object, the pull-out aiding device 100 of the second embodiment is movably mounted to an outer surface of the first partitioning wall 210. In this case, the first partitioning wall 210 is formed with a receiving recess 213, in which a window is provided. The pulling member 110 is extended through the window with the abutting section 112 of the pulling member 110 being pressed against the rear side of the corresponding apparatus 300.

The handle member 120 is pivotally turnable about the second pivot section 122 to move between a closed position, as shown in FIG. 12, and a pulled-out position, as shown in FIG. 13. When the handle member 120 is in the closed position, the closing edge 121A is in contact with or located adjacent to the first partitioning wall 210; and when the handle member 120 is in the pulled-out position, the pulling-out edge 121B is in contact with or located adjacent to the first partitioning wall 210 and the abutting section 112 is pulled to move forward by a distance relative to the first partitioning wall 210.

According to the second embodiment, when the handle member 120 is in the closed position, it is located in parallel or non-perpendicular to the first partitioning wall 210; and when the handle member 120 is in the pulled-out position, it is located perpendicular or non-parallel to the first partitioning wall 210.

Similar to the first embodiment, when the handle member 120 of the pull-out aiding device 100 according to the second embodiment is operated to turn from the closed position to the pulled-out position, since the vertical distance between the pulling-out edge 121B of the pressing section 121 and the second pivot section 122 is larger than the vertical distance between the closing edge 121A of the pressing section 121 and the second pivot section 122, the pulling member 110 is brought by the handle member 120 to move forward toward the opening of the object. At this point, the abutting section 112 pushes the corresponding apparatus 300 forward to thereby separate the latter from the connection port 410 and bring a front side of the corresponding apparatus 300 to extend beyond the first and the second partitioning wall 210, 220. Then, the handle member 120 can be further forward pulled by a predetermined distance for the corresponding apparatus 300 to expose more from the opening of the object and a user can conveniently remove the corresponding apparatus 300 from the object with one hand.

In the second embodiment, the abutting section 112 is in the form of an L-shaped arm for abutting against the rear side of the corresponding apparatus 300. When the pulling member 110 is moved forward, the abutting section 112 also pushes the corresponding apparatus 300 forward. However, it is understood the abutting section 112 is not necessarily limited to the L-shaped arm but can be other differently shaped structures, such as a hook, a latch or a stepped structure.

Figure 14:
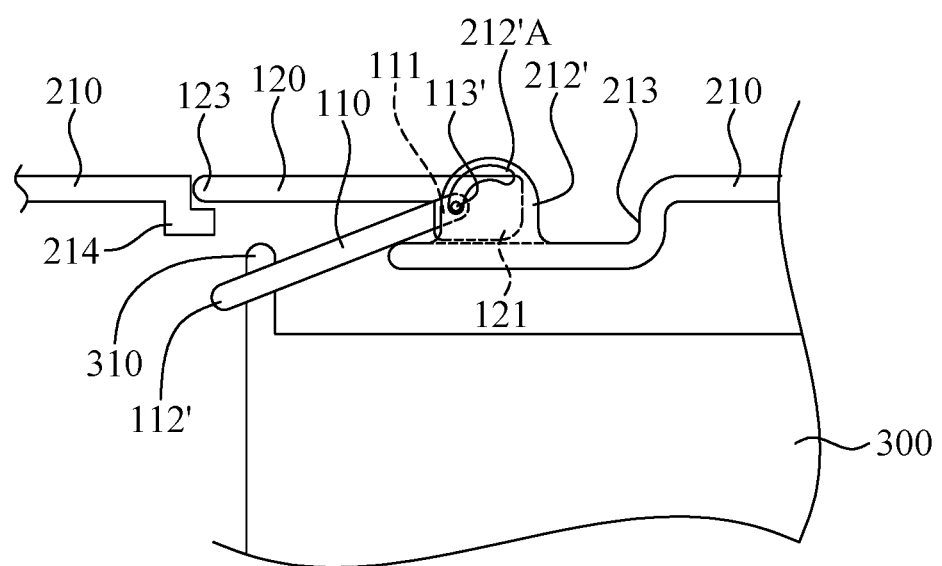
FIG. 14 shows a first variation of the pull-out aiding device according to the second embodiment of the present invention.
Figure 15:
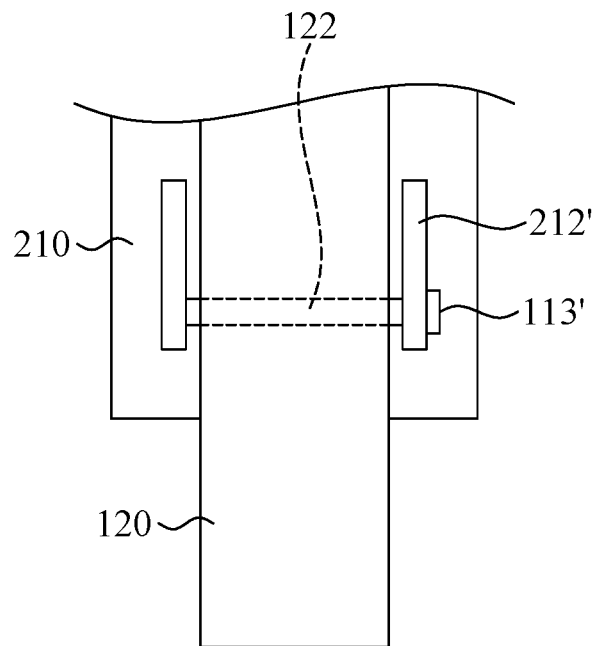
FIG. 15 is a fragmentary top plan view of FIG. 14.
Figure 16:
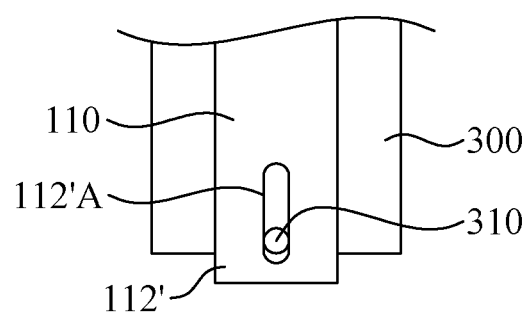
FIG. 16 is another fragmentary top plan view of FIG. 14.

Referring to FIGS. 14, 15 and 16, in which a first variation of the second embodiment is shown.

As can be seen in FIGS. 14 and 15, in the first variation of the second embodiment, the pull-out aiding device has a first limiting unit 113' that is in the form of a guide rod and located at an end of the pulling member 110 having the first pivot section 122 formed thereat. Meanwhile, the first partitioning wall 210 has a second limiting unit 212' that is in the form of a supporting seat provided with a guide rail 212'A. The guide rod forming the first limiting unit 113' is engaged with the guide rail 212'A to move in along a path defined by the guide rail 212'A.

As can be seen in FIG. 16, in the first variation of the second embodiment, the pulling member 110 has an abutting section 112' provided with a retaining hole 112'A. In this case, the corresponding apparatus 300 is provided with a projected interfering section 310 for correspondingly engaging with the retaining hole 112'A. Accordingly, when the pulling member 110 is moved, the abutting section 112' pushes against the corresponding apparatus 300, bringing the corresponding apparatus 300 or the first partitioning wall 210 to move at the same time.

Figure 17:
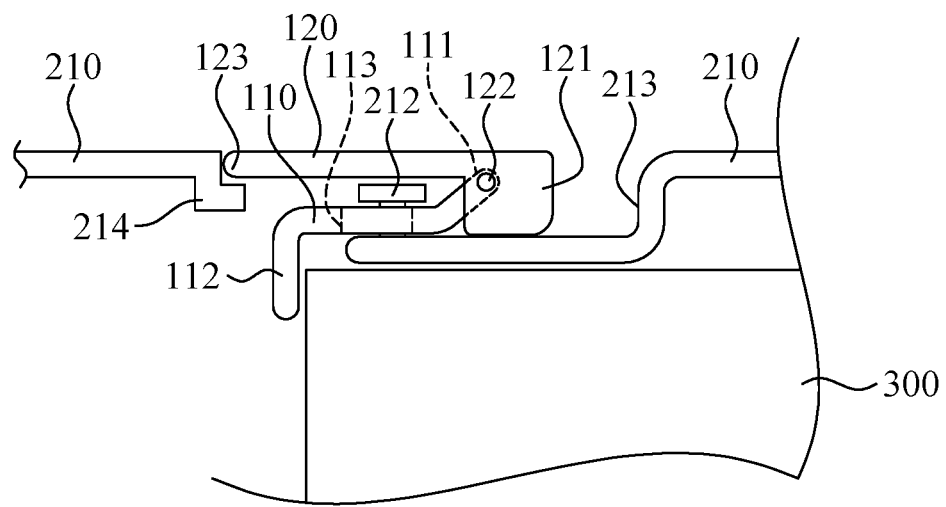
FIG. 17 is a schematic view of a second variation of the pull-out aiding device according to the second embodiment of the present invention.

Please refer to FIG. 17, in which a second variation of the second embodiment is shown.

In the second variation of the second embodiment, the pulling member 110 has a first limiting unit 113. When the handle member 120 is in the pulled-out position, the first limiting unit 113 interferes with a second limiting unit 212 provided on the first partitioning wall 210 to limit a maximum length by which the pulling member 110 can be pulled out beyond the first partitioning wall 210. In the second variation of the second embodiment, the first limiting unit 113 is, for example, an elongated hole and the second limiting unit 212 is a protruded body adapted to be correspondingly received in the above-mentioned elongated hole. In practical implementation of the present invention, the protruded body can be a screw, a nut or a rivet locked to the first partitioning wall 210.

In this case, the pulling member 110 can have an L-shaped or a hook-like configuration and includes a first pivot section 111 formed at an extended bent portion of the L-shaped or hook-like pulling member 110. The first pivot section 111 is pivotally connected to the second pivot section 122.

Figure 18:
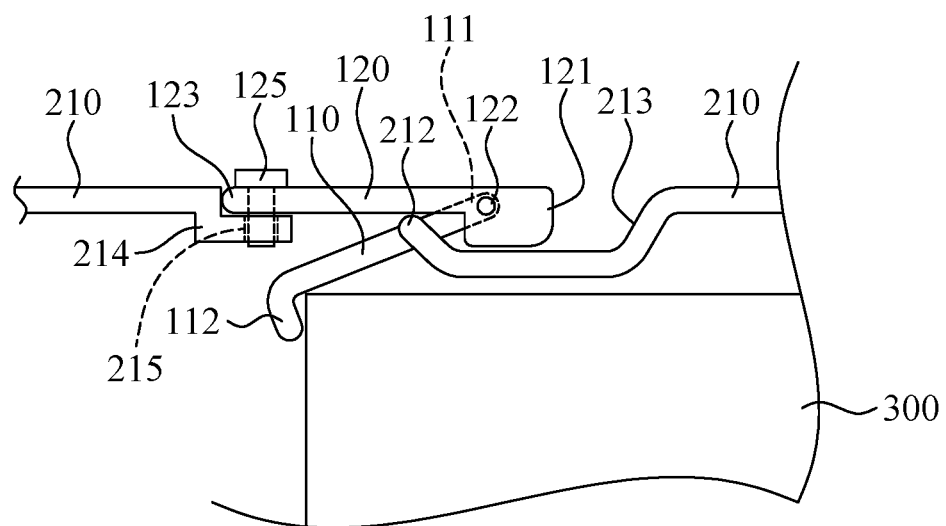
FIG. 18 is a schematic view of a third variation of the pull-out aiding device according to the second embodiment of the present invention.

FIG. 18 shows a third variation of the second embodiment of the present invention.

In the third variation of the second embodiment, the handle member 120 includes a fixing section 125. When the handle member 120 is in the closed position, the fixing section 125 is used to temporarily fix the handle member 120 to the first partitioning wall 210. For example, the fixing section 125 can be a fastening bolt extended through the handle member 120. In this case, the first partitioning wall 210 is correspondingly provided with a fastening hole 215. To operate the handle member 120, first turn and loosen the fixing section 125 from the fastening hole 215 to allow the handle member 120 to be freely turned and moved.

In the third variation of the second embodiment, the first partitioning wall 210 has a stop flange 214 that is located corresponding to the operating section 123 of the handle member 120 when the latter is in the closed position. The stop flange 214 functions to stop the operating section 123 from moving into the first partitioning wall 210 and accordingly, hold the pulling member 110 in place. Preferably, the fixing section 125 is provided on the operating section 123 and the fastening hole 215 is provided on the stop flange 214 corresponding to the fixing section 125.

In the third variation of the second embodiment, the first partitioning wall 210 has a second limiting unit 212, which is in the form of an elongated hole. The pulling member 110 is extended through the second limiting unit 212 to move in along the second limiting unit 212. The second limiting unit 212 functions to limit a distance by which the pulling member 110 can be moved.

Figure 19:
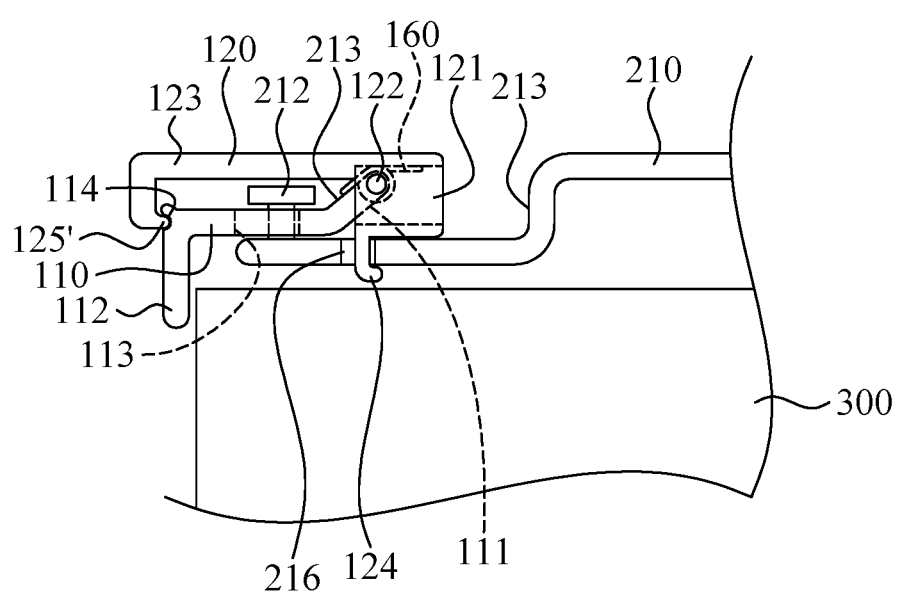
FIG. 19 is a schematic view of a fourth variation of the pull-out aiding device according to the second embodiment of the present invention.

FIG. 19 shows a fourth variation of the second embodiment of the present invention.

In the fourth variation of the second embodiment, the second pivot section 122 of the handle member 120 and the first pivot section 111 of the pulling member 110 are pivotally turnably connected together via a shaft; and the pull-out aiding device 100 further includes an elastic element 160. The elastic element 160 is fitted on around the shaft to elastically push against the pulling member 110 and the handle member 120. Therefore, when the handle member 120 is opened and not held in place by a user, the handle member 120 is automatically turned by a spring force of the elastic element 160 to the closed position.

Further, the handle member 120 includes a limiting section 124, which is located adjacent to the closing edge of the pressing section 121. In this case, the first partitioning wall 210 is correspondingly provided with a mating limiting section 216. The limiting section 124 can be extended through the mating limiting section 216 and hooked thereto, so that the handle member 120 is stopped from moving relative to the first partitioning wall 210.

In the fourth variation of the second embodiment, the handle member 120 further has a fixing section 125'. When the handle member 120 is in the closed position, the fixing section 125' temporarily fixes the handle member 120 to the first partitioning wall 210. For example, the fixing section 125' can be a hook-like body. In this case, the pulling member 110 is correspondingly provided with a hooking groove 114. To operate the handle member 120, first apply a force to pull the handle member 120, so that the fixing section 125' is separated from the hooking groove 114 of the pulling member 110, allowing the handle member 120 to be turned freely.

Figure 20:
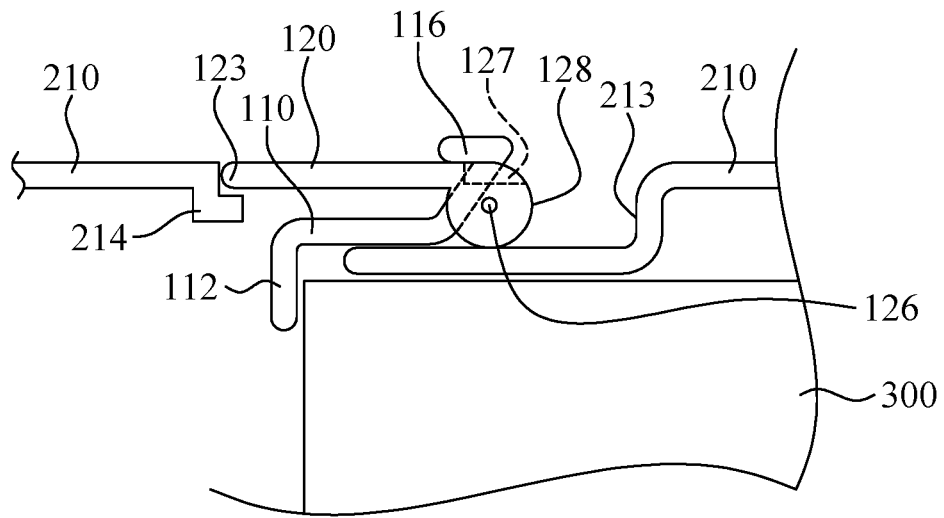
FIG. 20 is a schematic view showing a pull-out aiding device according to a third embodiment of the present invention and a corresponding apparatus to be pulled out with the pull-out aiding device.

Please refer to FIG. 20, in which a pull-out aiding device according to a third embodiment of the present invention is shown.

In the third embodiment, the pulling member 110 of the pull-out aiding device includes a first coupling section 116 and an abutting section 112, which is used to move the corresponding apparatus 300; and the handle member 120 includes a rotation shaft portion 126, a second coupling section 127 and an operating section 123. The second coupling section 127 and the first coupling section 116 are connected together while they are movable relative to each other. The handle member 120 is rotatable about the rotation shaft portion 126, and the rotation shaft portion 126 is rotatably associated with the first partitioning wall 210. In the third embodiment, the rotation shaft portion 126 associated with the first partitioning wall 210 can translate over the first partitioning wall 210.

Wherein, the second coupling section 127 is a hole, and the first coupling section 116 is a protruded body, a hook, a recessed body or a fastening body extended through the hole 127.

Further, as can be seen in FIG. 20, the rotation shaft portion 126 formed at an end of the handle member 120 has a cylindrical circumference 128, which is pressed against a bottom of the receiving recess 213 of the first partitioning wall 210, such that the pulling member 110 can be smoothly turned about the rotation shaft portion 126.

By operating the handle member 120 at the operating section 123, a user can turn the handle member 120 about the rotation shaft portion 126 to a position perpendicular or nonparallel to the first partitioning wall 210. Then, pull the operating section 123 to translate the same. At this point, the handle member 120 brings the pulling member 110 to move along with it, causing the abutting section 112 of the pulling member 110 to push the corresponding apparatus 300 forward, such that the corresponding apparatus 300 can be conveniently removed from the object.

Figure 21:
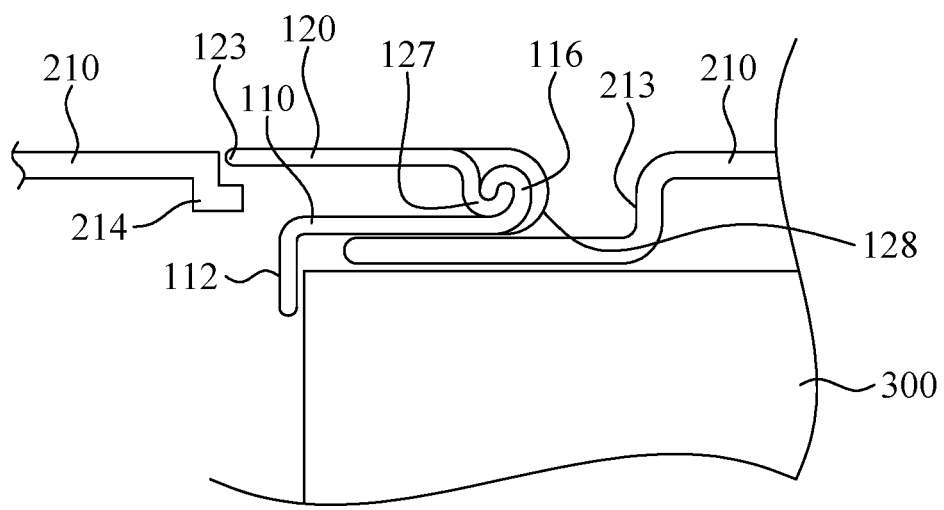
FIG. 21 is a schematic view of a variation of the pull-out aiding device according to the third embodiment of the present invention.

Please refer to FIG. 21, in which a pull-out aiding device according to a variation of the third embodiment of the present invention is shown.

In the variation of the third embodiment, the second coupling section 127 is in the form of a hook, and the first coupling section 116 is in the form of a hook adapted to be engaged with the hook-shaped second coupling section 127. However, it is understood the first coupling section 116 is not necessarily limited to the above-described configuration. For example, the first coupling section 116 can be otherwise a hole, a protruded body, a recessed body or a fastening body.

Therefore, in this case, the user may operate the handle member 120 at the operating section 123 to turn the handle member 120 about the rotation shaft portion 126 until the handle member 120 is perpendicular or nonparallel to the first partitioning wall 210. Then, pull the operating section 123 to translate the same. At this point, the handle member 120 brings the pulling member 110 to move along with it, causing the abutting section 112 of the pulling member 110 to push the corresponding apparatus 300 forward, such that the corresponding apparatus 300 can be conveniently removed from the object.

Figure 22:
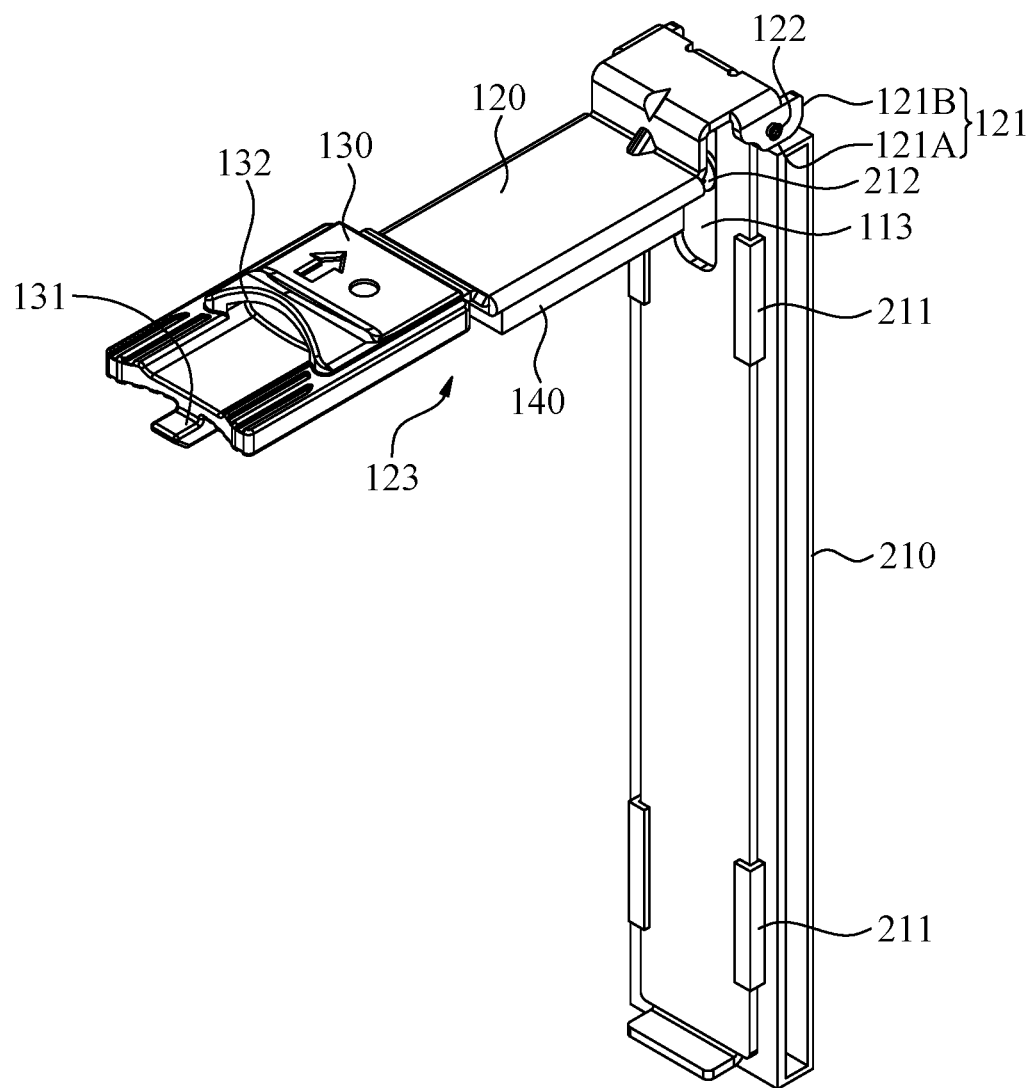
FIG. 22 is a perspective view showing a chassis-wall module according to a fourth embodiment of the present invention.
Figure 23:
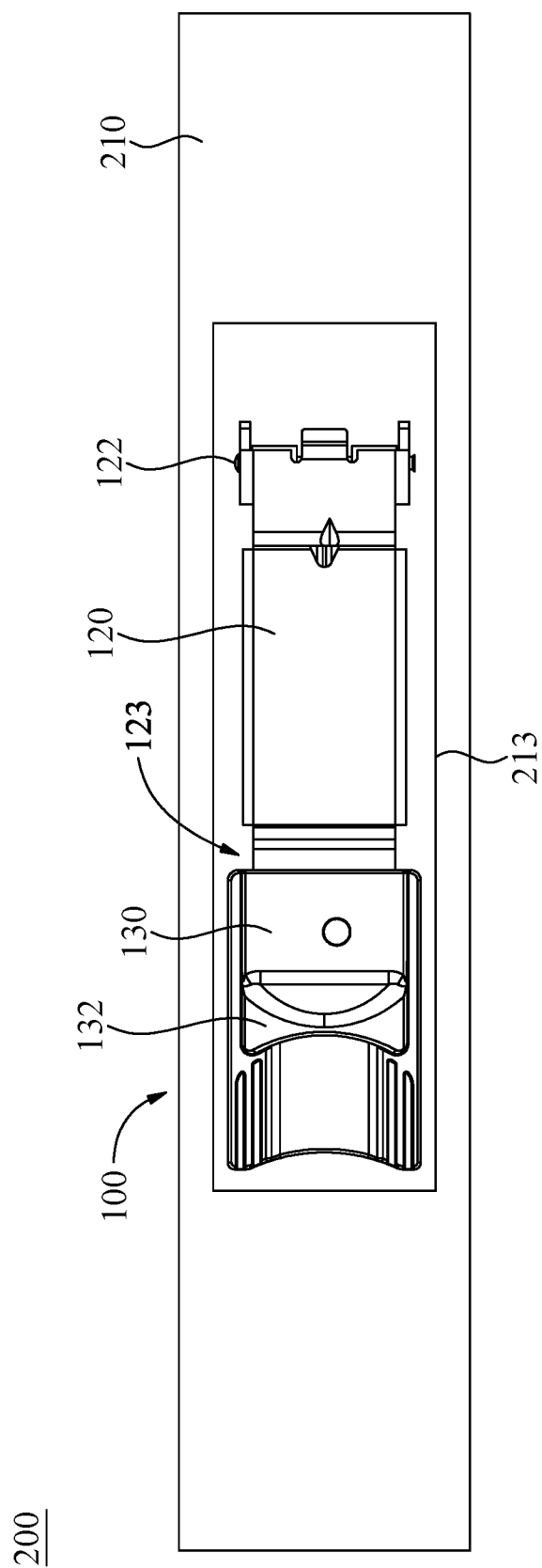
FIG. 23 is a plan view showing a variation of the chassis-wall module according the fourth embodiment of the present invention.

Please refer to FIG. 22, in which a chassis-wall module with pull-out aiding function 200 according to a fourth embodiment of the present invention is shown, and to FIG. 23, in which a variation of the fourth embodiment is shown.

As can be seen in FIG. 22, the chassis-wall module 200 includes a first partitioning wall 210 and a pull-out aiding device 100 described in the first embodiment of the present invention; and the pulling member 110 of the pull-out aiding device 100 is movably coupled with the first partitioning wall 210.

As shown in FIG. 23, a variation of the chassis-wall module 200 includes a first partitioning wall 210 and a pull-out aiding device 100 described in the second embodiment of the present invention; and the pulling member 110 of the pull-out aiding device 100 is movably coupled with the first partitioning wall 210. In this case, the first partitioning wall 210 includes a receiving recess 213, and the pulling member 110 is arranged in the receiving recess 213.

In summary, the pull-out aiding device 100 and the chassis-wall module 200 according to the present invention can be easily and effortlessly operated to help a user conveniently remove a corresponding apparatus from a chassis.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A pull-out aiding device being mounted on an object, the object having a first partitioning wall and a second partitioning wall and being configured for mounting a corresponding apparatus therein, the pull-out aiding device comprising:
a pulling member being movably coupled with the first partitioning wall and including a first pivot section and an abutting section, the pulling member is provided with a retainer, the abutting section and the retainer are respectively at a bottom end surface and a top end surface of the corresponding apparatus when the corresponding apparatus is mounted in the object; and
a handle member including a second pivot section and an operating section; and the second pivot section being pivotally connected to the first pivot section, such that the handle member is turnable about the second pivot section;
wherein the pulling member includes a bent section, and the bent section being located adjacent to the first pivot section and being pivotally connected to the second pivot section of the handle member via the first pivot section, the pulling member, the bent section and the first pivot section are one-piece, the bent section is at a free end of the pulling member, the first pivot section is at a free end of the bent section;
wherein the pulling member is provided with a first limiting unit and the first partitioning wall is provided with a second limiting unit; and the first and the second limiting unit interfering with each other;
wherein the first limiting unit includes at least one flanged boss and the second limiting unit includes at least one quick-release guide rail adapted to associate with the at least one flanged boss of the first limiting unit;
wherein the at least one flanged boss has a body portion and a flange portion formed around a free end of the body portion and the at least one quick-release guide rail has a rail portion and a quick-release hole portion communicable with the rail portion; the body portion of the at least one flanged boss being separately movably received in the rail portion; the flange portion of the at least one flanged boss having a diameter larger than a diameter of the body portion and a width of the rail portion; and the diameter of the flange portion being smaller than a diameter of the quick-release hole portion.

2. The pull-out aiding device as claimed in claim 1, further comprising a releasable fastening element; and the releasable fastening element being movably connected to the operating section of the handle member and including one or more latches used to engage with the second partitioning wall.

3. The pull-out aiding device as claimed in claim 1, further comprising a shock-absorbing member; and the shock-absorbing member being disposed on one side of the handle member facing toward the corresponding apparatus.

4. The pull-out aiding device as claimed in claim 1, wherein the first pivot section and the second pivot section is pivotally turnably connected to or engaged with each other via a shaft.

5. The pull-out aiding device as claimed in claim 1, wherein a distance between two flanged bosses of the at least one flanged boss is larger than a distance between two quick-release hole portions of the at least one quick-release guide rails.

6. The pull-out aiding device as claimed in claim 1, wherein the abutting section of the pulling member is provided with a retaining hole and the corresponding apparatus is provided with a projected interfering section corresponding to the retaining hole; and the retaining section being used to engage with the interfering section.

7. A pull-out aiding device being mounted on an object, the object having a first partitioning wall and a second partitioning wall and being configured for mounting a corresponding apparatus therein, the pull-out aiding device comprising:
a pulling member being movably coupled with the first partitioning wall and including a first pivot section and an abutting section; and
a handle member including a second pivot section and an operating section; and the second pivot section being pivotally connected to the first pivot section, such that the handle member is turnable about the second pivot section;
wherein the pulling member includes a bent section, and the bent section being located adjacent to the first pivot section and being pivotally connected to the second pivot section of the handle member via the first pivot section, the pulling member, the bent section and the first pivot section are one-piece, the bent section is at a free end of the pulling member, the first pivot section is at a free end of the bent section;
wherein the pulling member is provided with a first limiting unit and the first partitioning wall is provided with a second limiting unit; and the first and the second limiting unit interfering with each other; wherein the first limiting unit includes two flanged bosses and the second limiting unit includes two quick-release guide rails adapted to associate with the two flanged bosses of the first limiting unit;
wherein each flanged boss has a body portion and a flange portion formed around a free end of the body portion and each quick-release guide rail has a rail portion and a quick-release hole portion communicable with the rail portion; the body portion of the flanged boss being separately movably received in the rail portion; the flange portion of the flanged boss having a diameter larger than a diameter of the body portion and a width of the rail portion; and the diameter of the flange portion being smaller than a diameter of the quick-release hole portion;
wherein a distance between the two flanged bosses is larger than a distance between two quick-release hole portions of the two quick-release guide rails.

8. A pull-out aiding device being mounted on an object, the object having a first partitioning wall and a second partitioning wall and being configured for mounting a corresponding apparatus therein, the pull-out aiding device comprising:
a pulling member being movably coupled with the first partitioning wall and including a first pivot section and an abutting section, the pulling member having a bent section, the bent section being located adjacent to the first pivot section; and
a handle member including a second pivot section and an operating section; and the second pivot section being pivotally connected to the first pivot section, such that the handle member is turnable about the second pivot section;
wherein the pulling member, the bent section and the first pivot section are one-piece, the bent section is at a free end of the pulling member, the first pivot section is at a free end of the bent section;

wherein the pulling member is provided with a first limiting unit and the first partitioning wall is provided with a second limiting unit; and the first and the second limiting unit interfering with each other;

wherein the first limiting unit includes at least one flanged boss and the second limiting unit includes at least one quick-release guide rail adapted to associate with the at least one flanged boss of the first limiting unit;

wherein the at least one flanged boss has a body portion and a flange portion formed around a free end of the body portion and the at least one quick-release guide rail has a rail portion and a quick-release hole portion communicable with the rail portion; the body portion of the at least one flanged boss being separately movably received in the rail portion; the flange portion of the at least one flanged boss having a diameter larger than a diameter of the body portion and a width of the rail portion; and the diameter of the flange portion being smaller than a diameter of the quick-release hole portion;

wherein the pulling member is outward pulled from the object and the bent section is exposed from the object, the handle member and the bent section incline outward relative to the corresponding apparatus.

9. A pull-out aiding device being mounted on an object, the object having a first partitioning wall and a second partitioning wall and being configured for mounting a corresponding apparatus therein, the pull-out aiding device comprising:

a pulling member being movably coupled with the first partitioning wall and including a first pivot section and an abutting section; and a handle member including a second pivot section and an operating section; and the second pivot section being pivotally connected to the first pivot section, such that the handle member is turnable about the second pivot section;

wherein the pulling member is provided with a first limiting unit and the first partitioning wall is provided with a second limiting unit; and the first and the second limiting unit interfering with each other;

wherein the first limiting unit includes two flanged bosses and the second limiting unit includes two quick-release guide rails adapted to associate with the two flanged bosses of the first limiting unit;

wherein each flanged boss has a body portion and a flange portion formed around a free end of the body portion and each quick-release guide rail has a rail portion and a quick-release hole portion communicable with the rail portion; the body portion of the flanged boss being separately movably received in the rail portion; the flange portion of the flanged boss having a diameter larger than a diameter of the body portion and a width of the rail portion; and the diameter of the flange portion being smaller than a diameter of the quick-release hole portion;

wherein a distance between the two flanged bosses is larger than a distance between two quick-release hole portions of the two quick-release guide rails, the distance between the two flanged bosses is fixed, the distance between two quick-release hole portions of the two quick-release guide rails is fixed.

* * * * *